United States Patent
Kim

(10) Patent No.: US 7,211,947 B2
(45) Date of Patent: May 1, 2007

(54) ORGANIC EL DISPLAY PANEL FOR REDUCING RESISTANCE OF ELECTRODE LINES

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 200 days.

(21) Appl. No.: 10/654,896

(22) Filed: Sep. 5, 2003

(65) Prior Publication Data

US 2004/0160176 A1    Aug. 19, 2004

(30) Foreign Application Priority Data

Sep. 5, 2002    (KR) ............... 10-2002-0053562

(51) Int. Cl.
*H01L 51/50* (2006.01)
(52) U.S. Cl. ........................ 313/506; 313/504
(58) Field of Classification Search ......... 313/501–512
See application file for complete search history.

(56) References Cited

U.S. PATENT DOCUMENTS

| | | | |
|---|---|---|---|
| 4,266,223 A | 5/1981 | Frame | 340/719 |
| 4,720,432 A * | 1/1988 | VanSlyke et al. | 428/457 |
| 6,107,735 A | 8/2000 | Hora | 313/506 |
| 6,876,007 B2 * | 4/2005 | Yamazaki et al. | 257/88 |

FOREIGN PATENT DOCUMENTS

| | | |
|---|---|---|
| EP | 0 966 182 A1 | 12/1999 |
| EP | 1 022 931 A1 | 7/2000 |
| EP | 1 168 448 A2 | 1/2002 |
| EP | 1 195 814 A2 | 4/2002 |
| JP | 05-275172 | 10/1993 |
| JP | 2000-331783 | 11/2000 |

* cited by examiner

*Primary Examiner*—Joseph Williams
(74) *Attorney, Agent, or Firm*—Ked & Associates LLP.

(57) ABSTRACT

Method for fabricating an organic EL display panel having an EL region at every cross of first and second electrodes, including the steps of forming a plurality of first electrodes at regular intervals on a transparent substrate, forming an insulating layer in regions other than the EL regions, forming second supplementary electrodes on the insulating layer, forming an electric insulating barrier between adjacent EL regions perpendicular to the first electrodes, forming an organic EL layer in each of the EL regions with a shadow mask, depositing an electrode material on an entire surface inclusive of the organic EL layer, to form a plurality of second electrodes electrically connected to the second supplementary electrodes, and forming a protection film on an entire surface inclusive of the second electrodes.

18 Claims, 11 Drawing Sheets

ORGANIC EL DISPLAY PANEL FOR REDUCING RESISTANCE OF ELECTRODE LINES

This application claims the benefit of the Korean Application No. P2002-53562 filed on Sep. 5, 2002, which is hereby incorporated by reference.

BACKGROUND OF THE INVENTION

1. Field of the Invention

The present invention relates to display panels, and more particularly, to an organic EL display panel, and a method for fabricating the same.

2. Background of the Related Art

As a size of display becomes larger, demands on flat displays that occupies smaller spaces is increasing. As one of the flat displays, the organic EL display is paid attention. The organic EL display panel has advantages in that a thickness is thin, a matrix form of addressing is available, and a driving voltage is as low as below 15V.

There are a variety of full-color display methods in fabrication of the organic EL display panel, one of which that has the best luminance efficiency is a method employing a shadow mask. FIG. 1 illustrates a section showing a related art method for fabricating an organic EL display panel, and FIG. 2 illustrates a plan view of a shadow mask employed in FIG. 1.

Referring to FIGS. 1 and 2, in the related art method for fabricating an organic EL display panel, a transparent first electrode 2 is formed on a transparent substrate 1, a barrier (not shown) is formed thereon, and red, green, blue organic EL layer 3-1, 3-2, and 3—3 are formed in succession with a shadow mask 4 as shown in FIG. 2.

Then, second electrode material is deposited on an entire surface to form a second electrode in an EL region, thereby fabricating a full color organic EL display panel. The first electrode is an anode and a second electrode is a cathode.

However, the organic EL display panel fabricated thus has waste of power, and a consequential poor efficiency, caused by a resistance of the second electrode (cathode).

In order to overcome such a poor efficiency, though it is required that the second electrode line has a thickness greater than a certain value, it is difficult to fabricate a thickness greater than the certain value by the foregoing method.

SUMMARY OF THE INVENTION

Accordingly, the present invention is directed to an organic EL display panel, and a method for fabricating the same that substantially obviates one or more of the problems due to limitations and disadvantages of the related art.

An object of the present invention is to provide an organic EL display panel, and a method for fabricating the same, which can reduce resistances of electrode lines, to improve efficiency.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the organic EL display panel having an EL region at a cross of each of first and second electrodes, includes an electric insulating barrier formed between adjacent second electrodes for electrical insulation of the second electrodes, and a supplementary electrode around each of the EL regions, the supplementary electrode being electrically connected to one of the second electrodes.

The second electrode and the supplementary electrode are electrically connected in the vicinity of an edge of the EL region.

The supplementary electrode is formed of a material selected from Cr, Al, Au, W, Cu, Ni, and Ag.

In another aspect of the present invention, there is provided an organic EL display panel including a substrate, first electrodes on the substrate, first supplementary electrodes electrically connected to sides of the first electrodes respectively, second electrodes perpendicular to the first electrodes, an organic EL layer at every cross of the first and second electrodes, second supplementary electrodes electrically connected to the second electrodes around the EL layers respectively, and an electric insulating barrier between adjacent second electrodes for electric insulation of the second electrodes.

In further aspect of the present invention, there is provided a method for fabricating an organic EL display panel having an EL region at every cross of first and second electrodes, including the steps of forming a plurality of first electrodes at regular intervals on a transparent substrate, forming an insulating layer in regions other than the EL regions, forming second supplementary electrodes on the insulating layer, forming an electric insulating barrier between adjacent EL regions perpendicular to the first electrodes, forming an organic EL layer in each of the EL regions with a shadow mask, depositing an electrode material on an entire surface inclusive of the organic EL layer, to form a plurality of second electrodes electrically connected to the second supplementary electrodes, and forming a protection film on an entire surface inclusive of the second electrodes.

The step of forming a plurality of first electrodes further includes the step of forming first supplementary electrodes electrically connected to sides of the first electrodes.

The second supplementary electrodes includes projected parts in the vicinity of edges of the EL regions so as to be in contact with the second electrodes, respectively.

It is to be understood that both the foregoing description and the following detailed description of the present invention are exemplary and explanatory and are intended to provide further explanation of the invention claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings. FIGS. 3A~3G illustrate perspective views each showing the steps of a method for fabricating an organic EL display panel in accordance with a preferred embodiment of the present invention, and FIGS. 4A~4G illustrate plan views each showing the steps of a method for fabricating an organic EL display panel in accordance with a preferred embodiment of the present invention.

Figure 1:
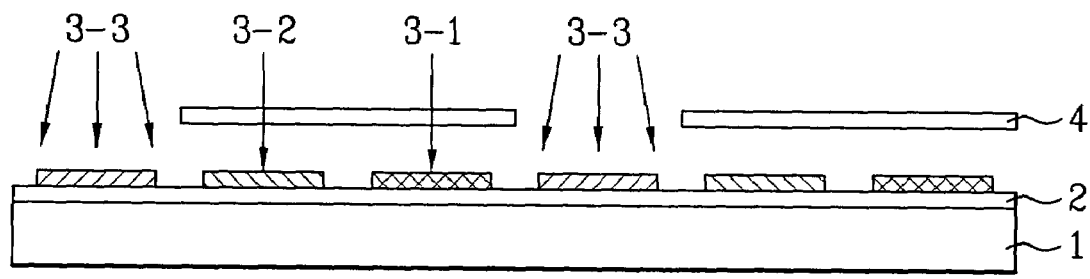
FIG. 1 illustrates a section showing a related art method for fabricating an organic EL display panel.
Figure 2:
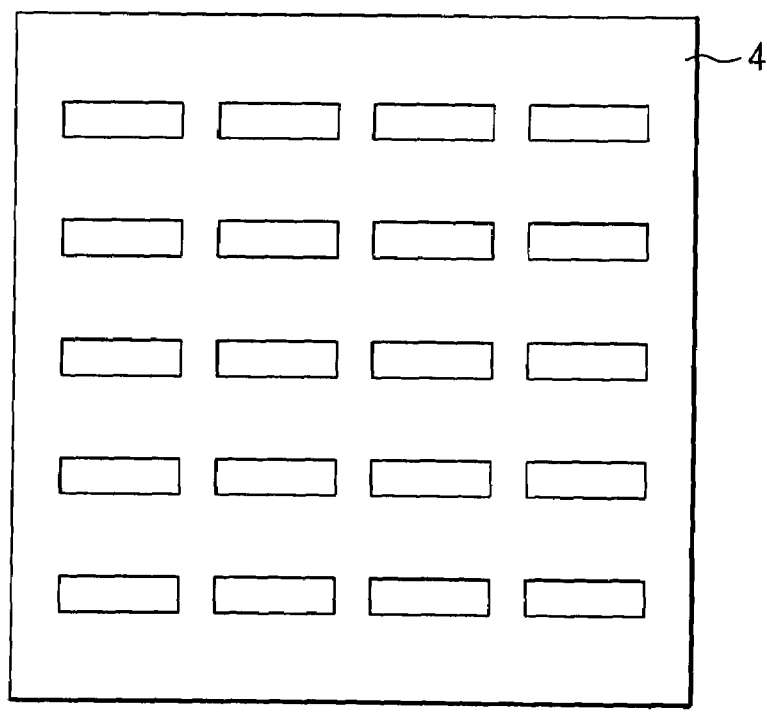
FIG. 2 illustrates a plan view of a shadow mask employed in FIG. 1.
Figure 3A:
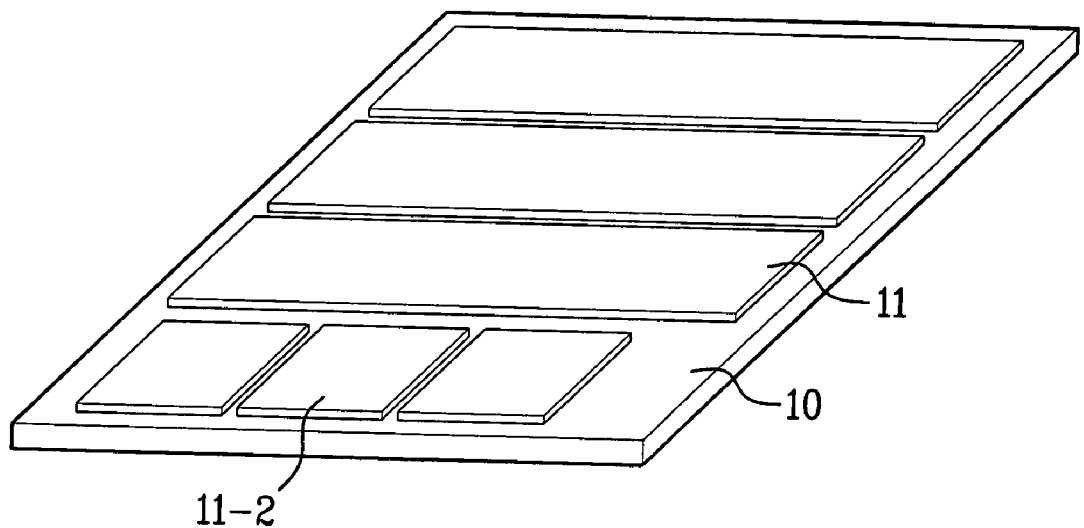
FIGS. 3A~3G illustrate perspective views each showing the steps of a method for fabricating an organic EL display panel in accordance with a preferred embodiment of the present invention.
Figure 4A:
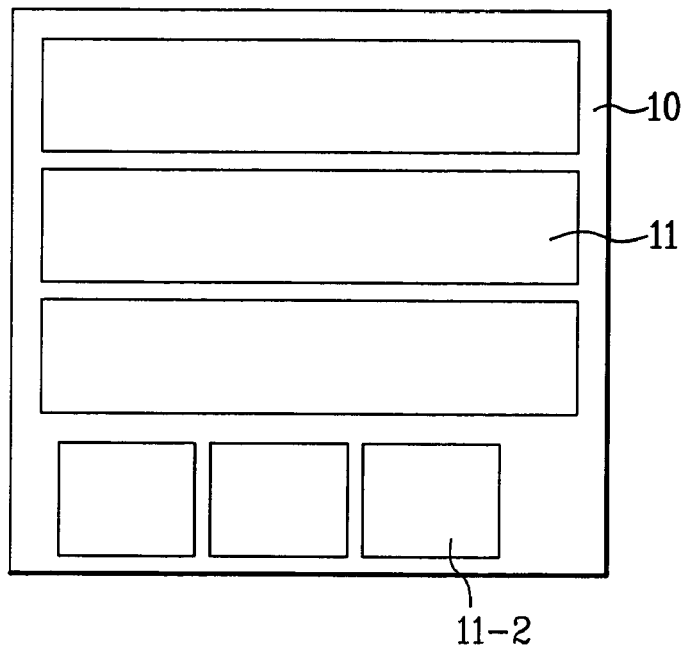
FIGS. 4A~4G illustrate plan views each showing the steps of a method for fabricating an organic EL display panel in accordance with a preferred embodiment of the present invention.

Referring to FIGS. 3A and 4A, first electrodes 11 and pads 11-2 of second electrodes are formed of transparent material on a transparent substrate 10.

Figure 3B:
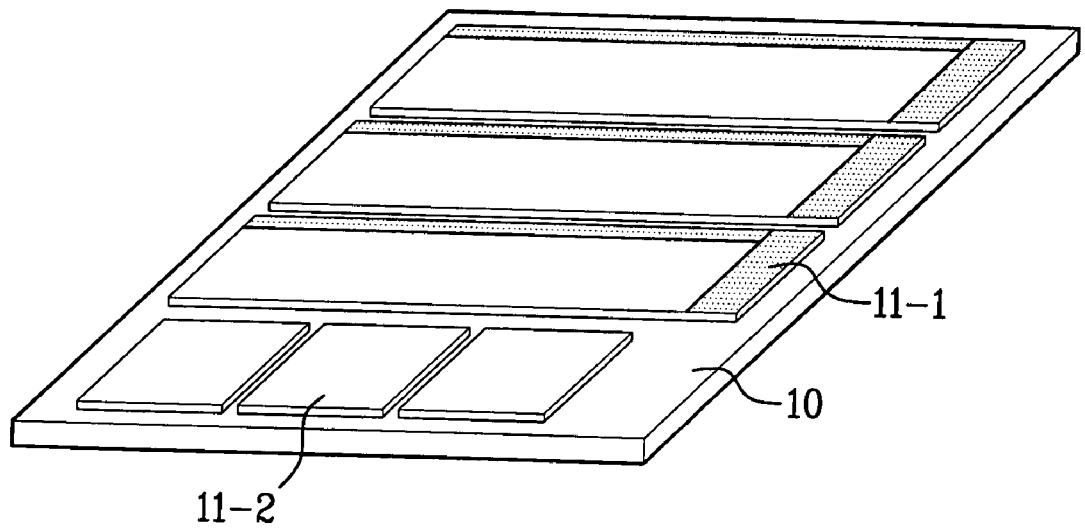
Figure 4B:
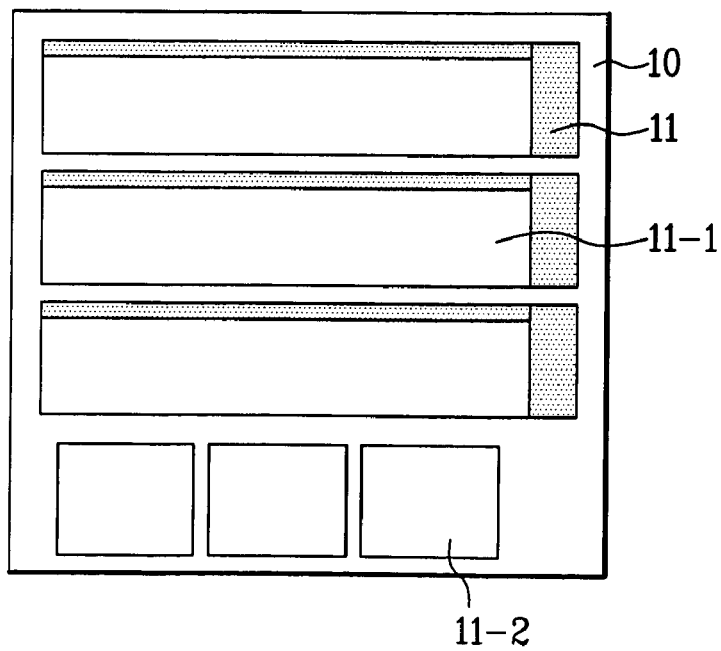

Then, referring to FIGS. 3B and 4B, for reducing resistance of the first electrodes 11, a first supplementary electrode 11-1 is formed such that a part of the first supplementary electrode 11-1 is overlapped with an edge of each of the first electrodes 11. The first supplementary electrode 11-1 is formed of a metal that has a resistance relatively lower than ITO of the first electrode 11, such as Cr, Al, Cu, W, Au, Ni, and Ag.

Figure 3C:
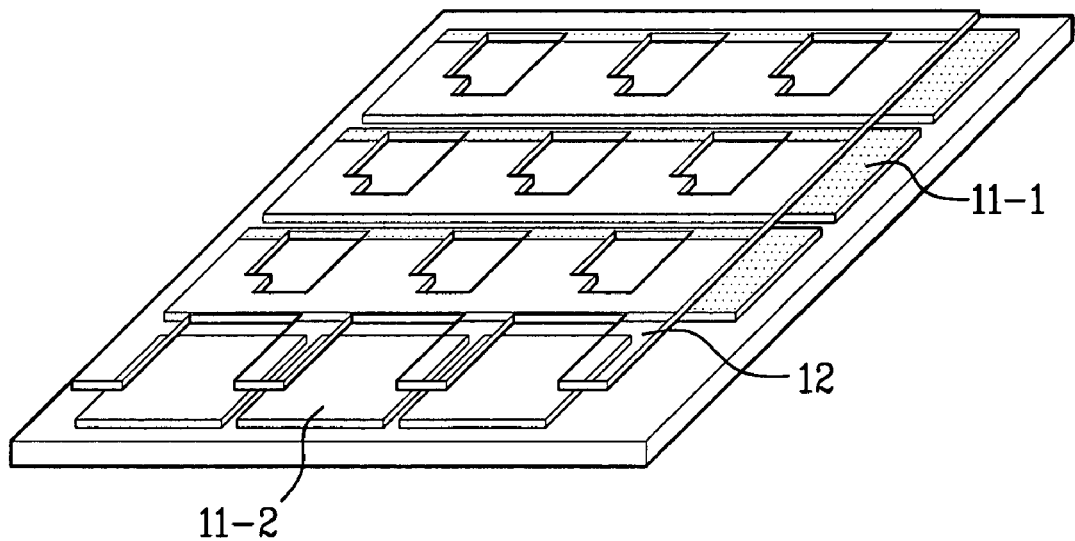
Figure 4C:
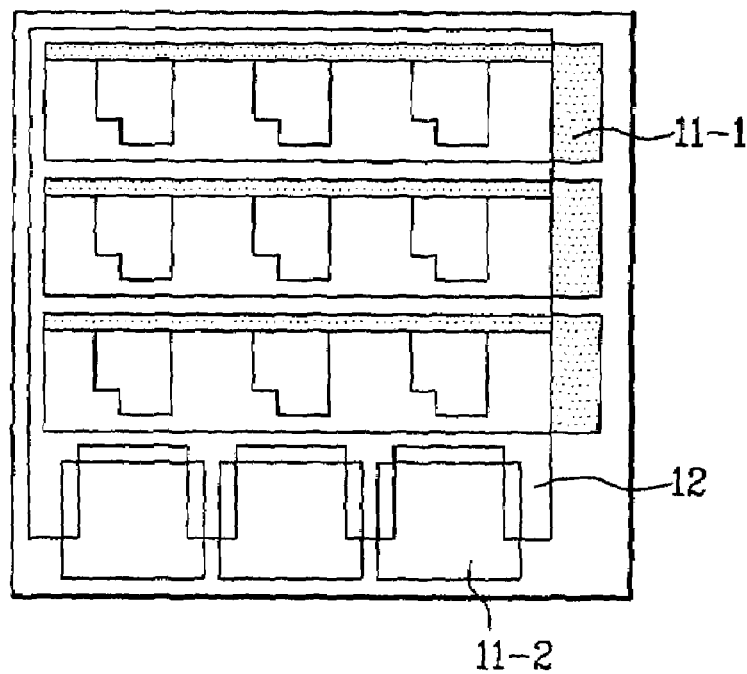

Referring to FIGS. 3C and 4C, an insulating layer 12 is formed in region except an EL region. The insulating layer 12 may be formed of any organic or inorganic material, as far as the material is insulator.

Figure 3D:
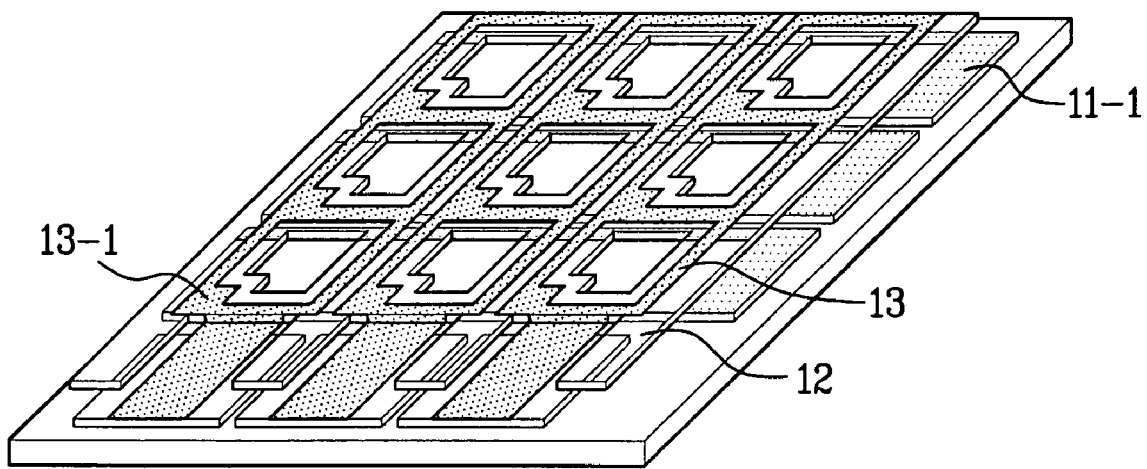
Figure 4D:
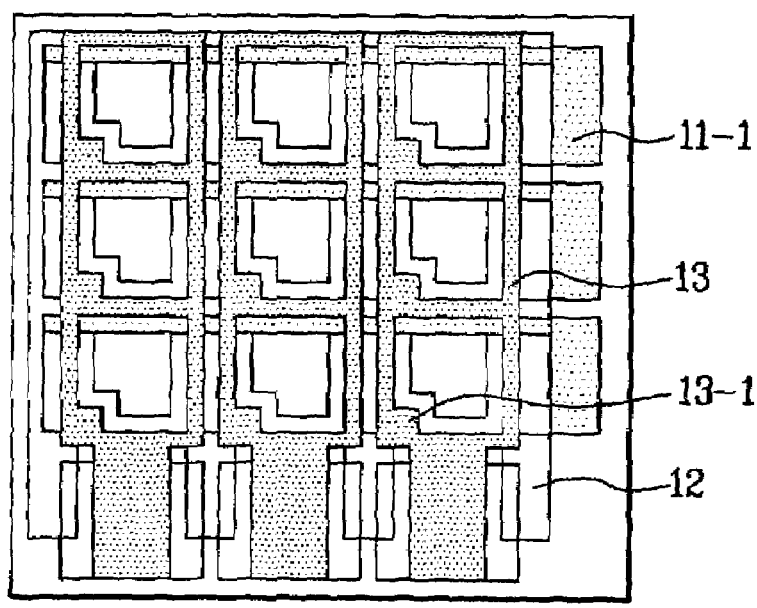

Referring to FIGS. 3D and 4D, a second supplementary electrodes 13 are formed on the insulating layer 12. Each of the second supplementary electrodes 13 has a projected part 13-1 in the vicinity of the edge of the EL region so as to be in contact with each of the second electrodes, electrically. The second supplementary electrode 13 to be in contact with each of the second electrodes is formed of a metal having a resistance lower than the second electrodes relatively, such as Cr, Al, Cu, W, Au, Ni, and Ag.

Figure 3E:
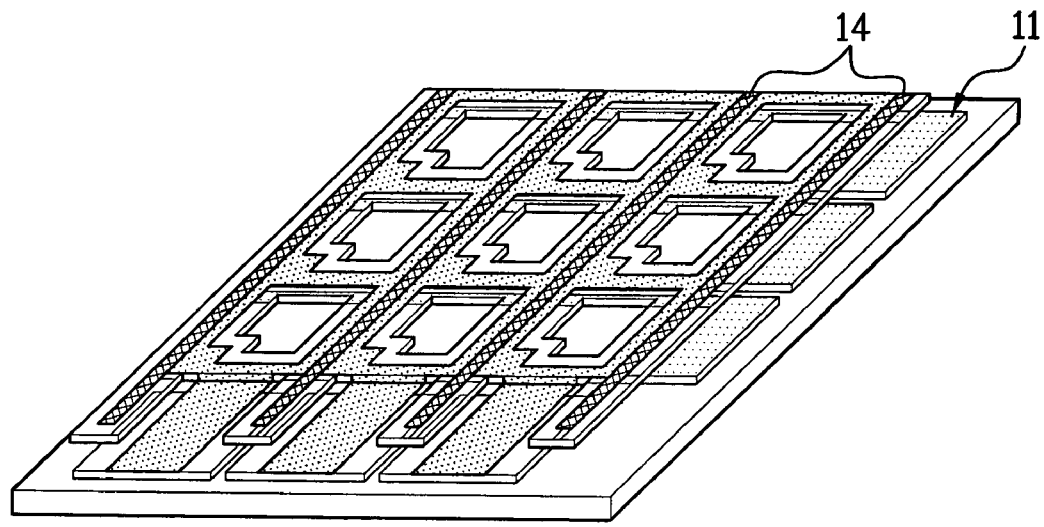
Figure 4E:
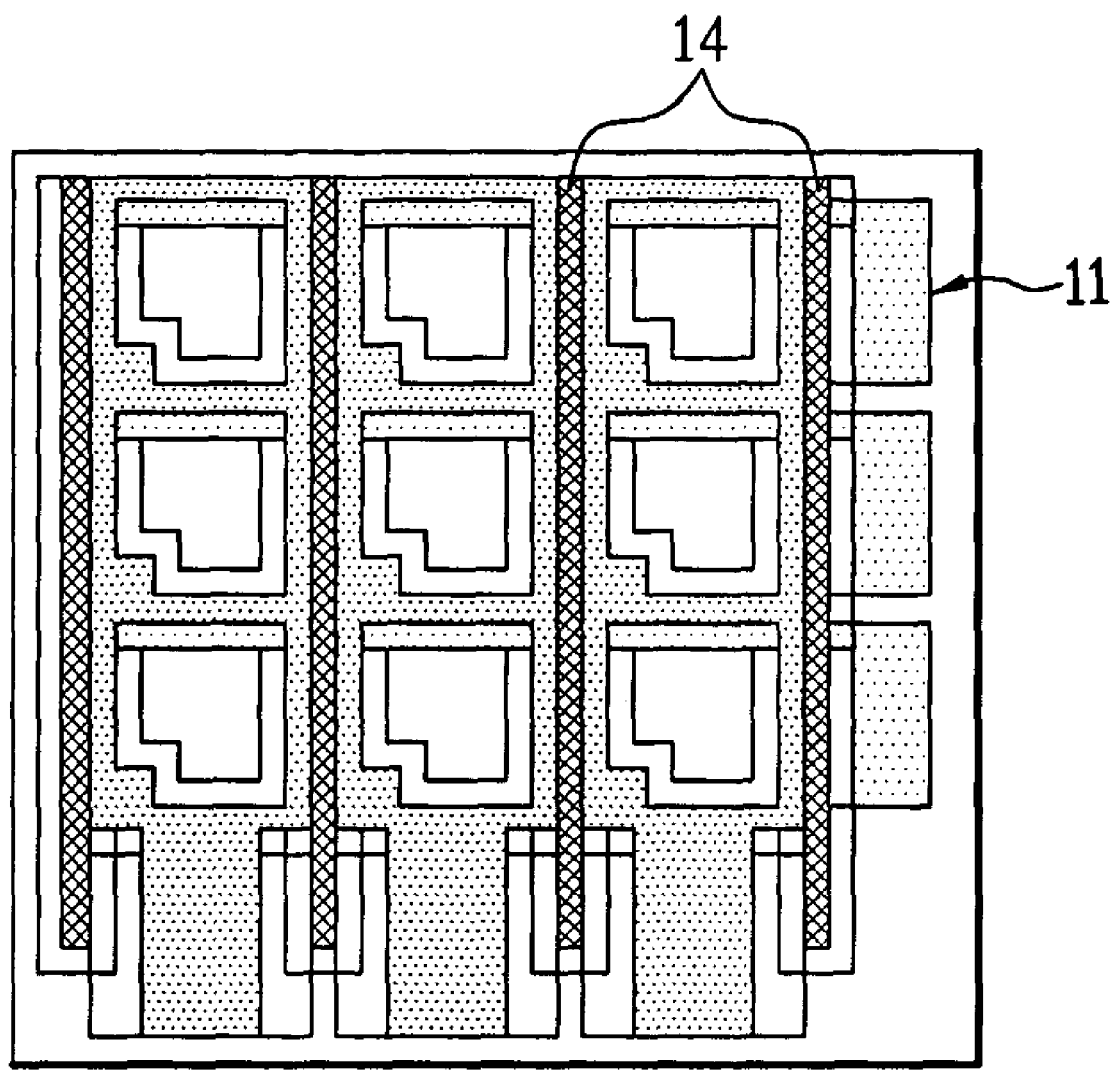

Referring to FIGS. 3E and 4E, a buffer layer (not shown) is formed between adjacent EL regions in a direction perpendicular to the first electrode 11, and an electric insulating barrier on each of the buffer layers.

Figure 3F:
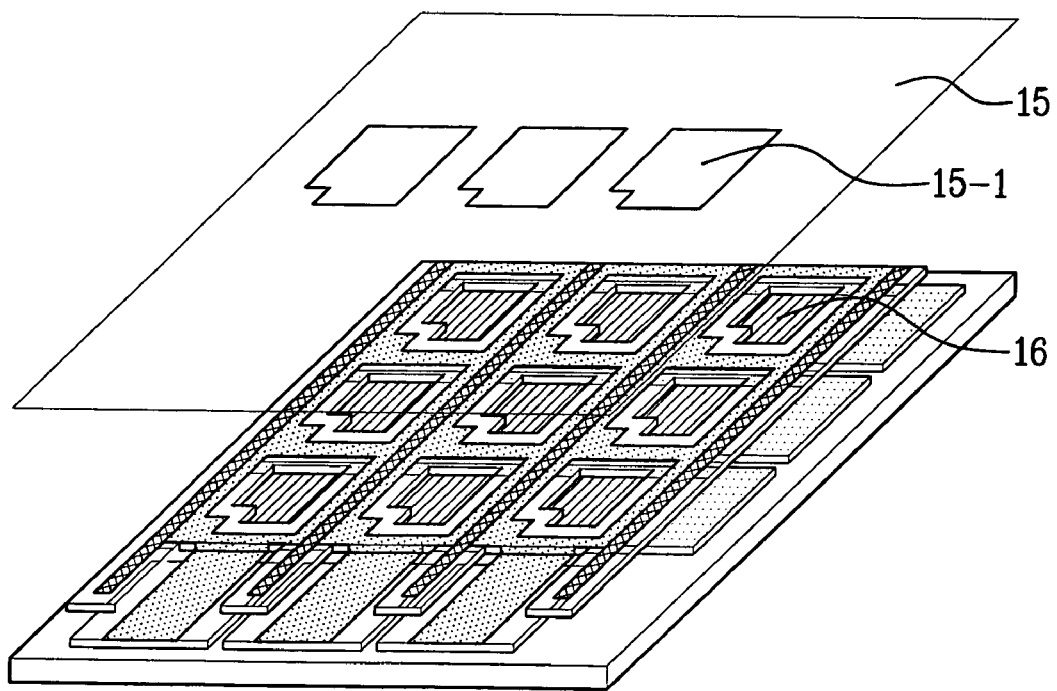
Figure 4F:
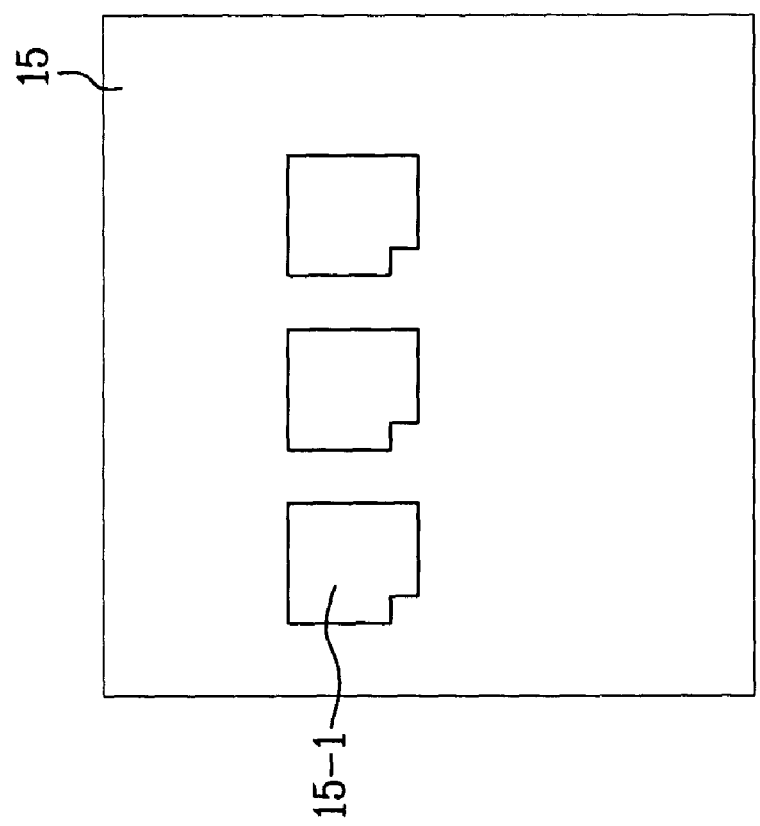
Figure 4F:
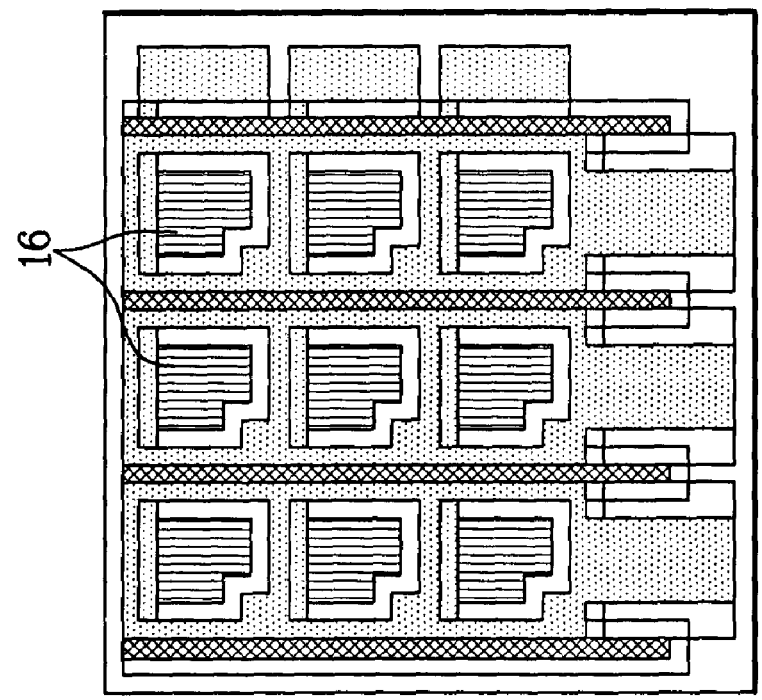

Referring to FIGS. 3F and 4F, an organic EL layer 16 is formed in each of the EL regions with a shadow mask 15 having a plurality of via holes 15-1. The via holes 15-1 in the shadow mask 15 are in conformity with the EL regions.

Figure 3G:
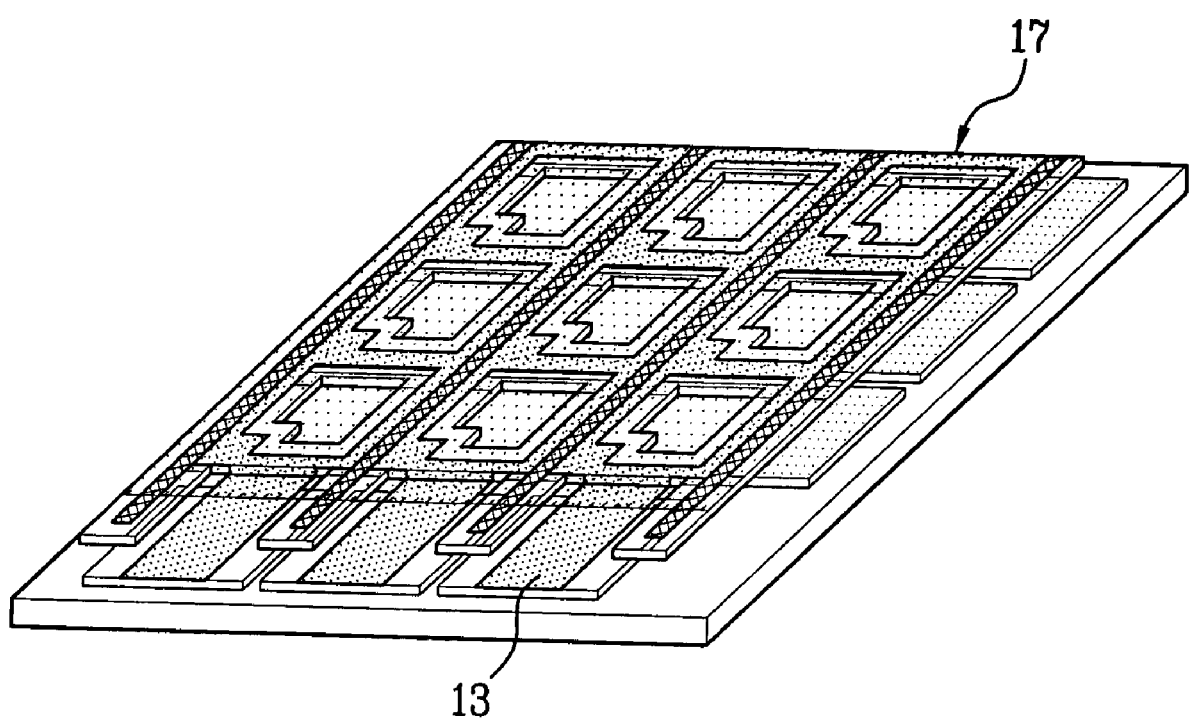
Figure 4G:
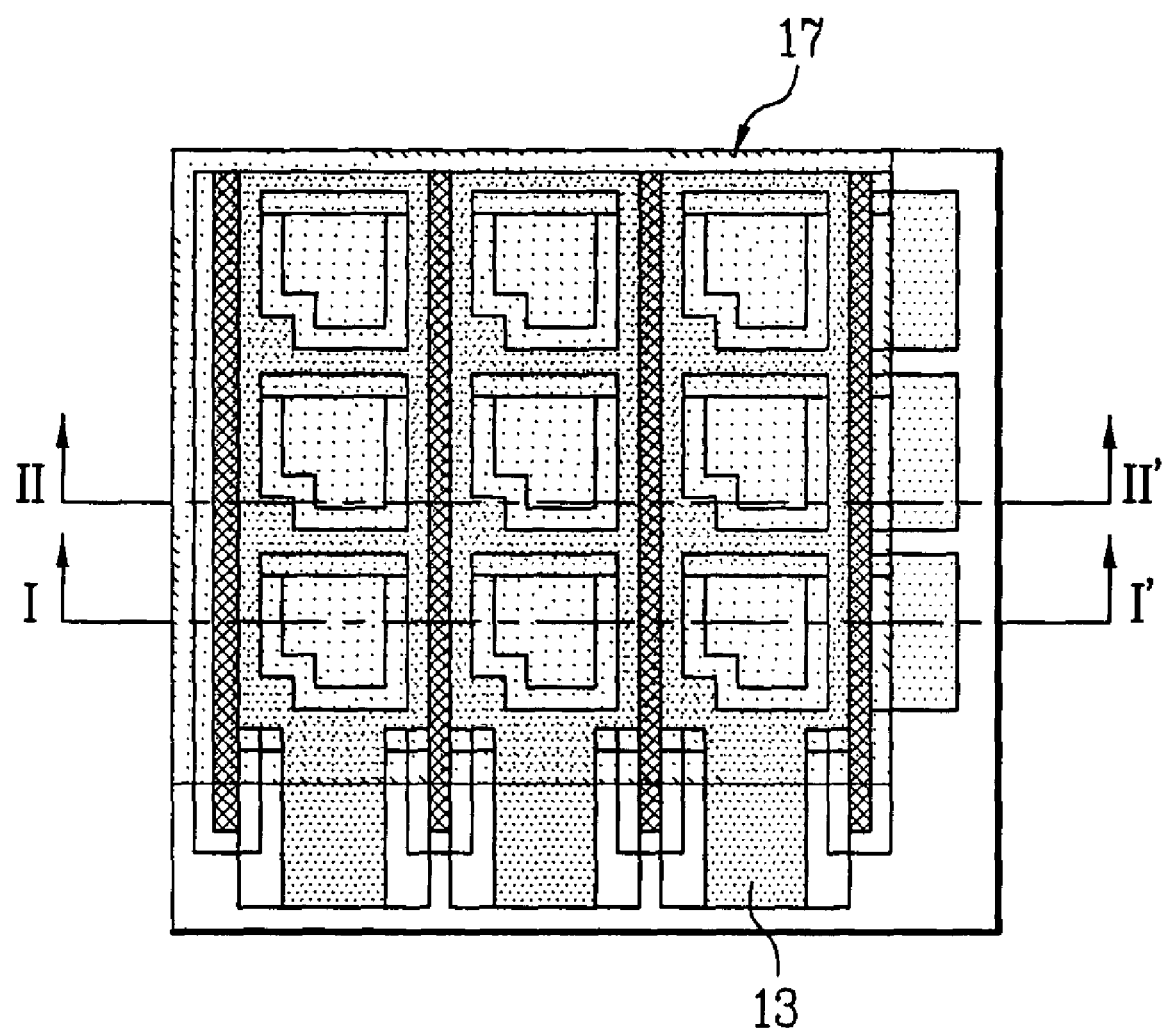

Then, referring to FIGS. 3G and 4G, an electrode material is deposited on an entire surface inclusive of the organic EL layer, to form a plurality of second electrodes 17 electrically connected to the second supplementary electrodes 13, respectively.

Though not shown, a protection film is formed on an entire surface inclusive of the second electrode 17, and an encapsulation is carried out, to finish fabrication of the organic EL display panel. The first electrode is an anode and the second electrode is cathode.

Figure 5A:
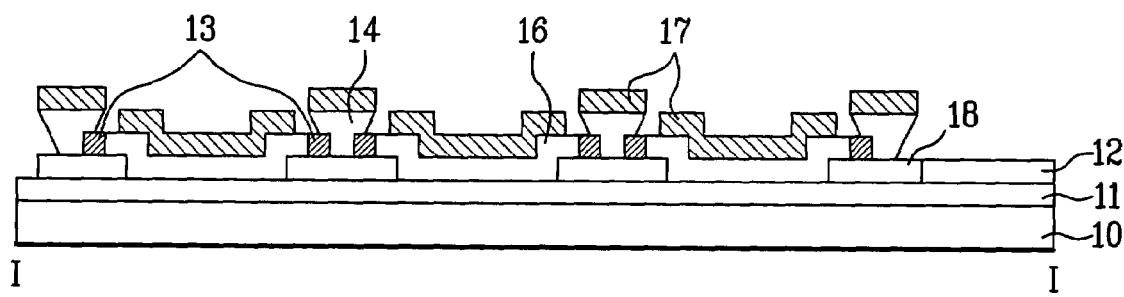
FIG. 5A illustrates a section across a line I—I in FIG. 4G.
Figure 5B:
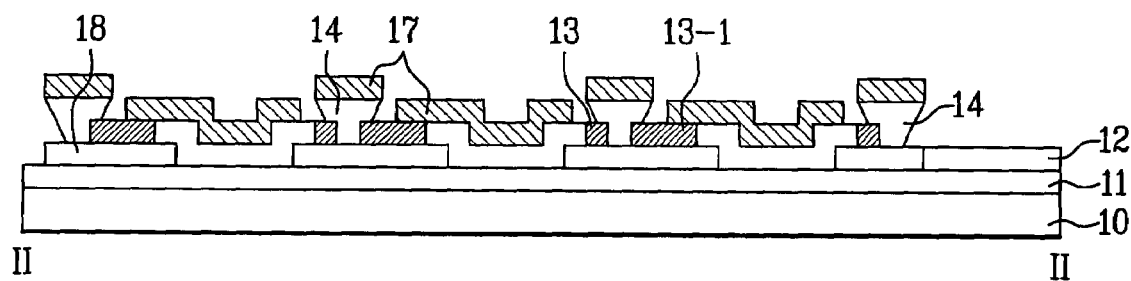
FIG. 5B illustrates a section across a line II—II in FIG. 4G.

FIG. 5A illustrates a section across a line I—I in FIG. 4G, and FIG. 5B illustrates a section across a line II—II in FIG. 4G.

Referring to FIGS. 5A and 5B, the organic EL display panel of the present invention has an EL region at every cross of the first electrodes 11 and the second electrodes 17.

Moreover, the electric insulating barrier 14, formed on each of the buffer layers 18 between adjacent EL regions, insulates the second electrodes 17 from each other, electrically.

Furthermore, the second supplementary electrode 13, formed around each of the EL regions, is connected to each of the second electrodes 17, electrically. Each of the second electrodes 17 is connected to one of the projected parts 13-1 of the second supplementary electrodes 13.

Thus, since the second supplementary electrode can reduce a resistance of the second electrode (cathode), an efficiency of the organic EL display can be improved, and a power required for operating the organic EL display can be reduced, to reduce waste of power.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic EL display panel, comprising:
   a substrate having an EL region;
   an anode on the EL region of the substrate;
   an organic EL layer on the anode;
   a cathode on the organic EL layer; and
   a supplementary electrode around the EL region, the supplementary electrode being electrically connected to the cathode.

2. The organic EL display panel as claimed in claim 1, wherein the cathode and the supplementary electrode are electrically connected in the vicinity of an edge of the EL region.

3. The organic EL display panel as claimed in claim 1, wherein the supplementary electrode reduces resistance of the cathode.

4. The organic EL display panel as claimed in claim 1, wherein the supplementary electrode is formed of a material selected from Cr, Al, Au, W, Cu, Ni, and Ag.

5. The organic EL display panel as claimed in claim 1, wherein the supplementary electrode is formed on an insulating layer.

6. An organic EL display panel comprising:
   a substrate having an EL region;
   an anode on the El region of the substrate;
   a first supplementary electrode electrically connected to at least one side of the anode;
   an organic EL layer on the anode;
   a cathode on the organic EL layer; and
   a second supplementary electrode around the EL region, the second supplementary electrode being electrically connected to the cathode.

7. The organic EL display panel as claimed in claim 6, wherein the cathode and the second supplementary electrode are electrically connected in the vicinity of edges of at least one edge of the EL region.

8. The organic EL display panel as claimed in claim 6, wherein the first and second supplementary electrodes reduce resistance of the anode and cathode respectively.

9. The organic EL display panel as claimed in claim 6, wherein the first, and second supplementary electrodes are formed of a material selected from Cr, Al, Au, W, Cu, Ni, and Ag.

10. The organic EL display panel as claimed in claim 6, wherein the second supplementary electrode is formed on the insulating layer.

11. An organic EL display panel comprising:
    a substrate having an EL region;
    an anode on the EL region of the substrate;
    an organic EL layer on the anode;
    a cathode on the organic EL layer; and
    a supplementary electrode around the EL region, the supplementary electrode being electrically connected to the cathode, wherein the cathode and the supplementary electrode are connected in a vicinity of a corner of the EL region.

12. The organic EL display panel as claimed in claim 11, wherein the supplementary electrode reduces resistance of the cathode.

13. The organic EL display panel as claimed in claim 11, wherein the supplementary electrode is formed of a material selected from Cr, Al, Au, W, Cu, Ni, and Ag.

14. The organic EL display panel as claimed in claim 11, wherein the supplementary electrode is formed on an insulating layer which is located in an upper part of the anode or a lower part of the anode.

15. An organic EL display panel comprising:
    a substrate having an EL region;
    an anode on the EL region of the substrate;
    a supplementary electrode electrically connected to one side of the anode;
    an organic EL layer on the anode; and
    a cathode on the organic EL layer.

16. The organic EL display panel as claimed in claim 15, further comprising:
    another supplementary electrode electrically connected to the cathode, said another supplementary electrode made of a material which has a lower resistance than a material from which the cathode is made.

17. An organic EL display panel, comprising:
    a plurality of first electrodes which cross a plurality of second electrodes at respective pixel regions;
    EL regions located at respective areas where the first and second electrodes cross;
    an electric insulating barrier formed between adjacent ones of the second electrodes; and
    a supplementary electrode at each of the EL regions, the supplementary electrode being electrically coupled to a corresponding one of the second electrodes.

18. The organic EL display panel of claim 17, wherein each of the first electrodes are anodes and each of the second electrodes are cathodes.

* * * * *